United States Patent
Ueda (12) 
(10) Patent No.: US 6,338,582 B1
(45) Date of Patent: Jan. 15, 2002

(54) SUBSTRATE DELIVERY APPARATUS AND COATING AND DEVELOPING PROCESSING SYSTEM

(75) Inventor: Issei Ueda, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/605,526

(22) Filed: Jun. 29, 2000

(30) Foreign Application Priority Data

Jun. 30, 1999 (JP) .......................................... 11-186674

(51) Int. Cl.$^7$ ................................................ G03D 5/00
(52) U.S. Cl. ........................... 396/611; 355/30; 118/52; 414/935
(58) Field of Search ........................... 396/611; 118/52, 118/316, 319, 320, 668, 726, 500, 56, 666, 667; 134/2, 3, 902; 355/30; 414/935–941

(56) References Cited

U.S. PATENT DOCUMENTS 5,803,932 A  9/1998  Akimoto et al. ........... 29/25.01
6,126,338 A * 10/2000  Akimoto ..................... 396/611
6,133,981 A * 10/2000  Semba ........................ 396/611
6,215,545 B1 * 4/2001  Matsuyama ................. 396/611

* cited by examiner

Primary Examiner—D Rutledge
(74) Attorney, Agent, or Firm—Rader, Fishman & Grauer, PLLC (57) ABSTRACT

In an interface section, a transfer device is disposed to face a second cooling processing unit group in a processing station, and a thermal processing unit group in which thermal processing units are multi-tiered is disposed on one side and a peripheral aligner, a buffer cassette, and a wafer holding section which are vertically tiered from the top in order are disposed on the other side so that the transfer device is put between them. A secondary transfer body is disposed between the wafer holding section and an aligner, and a wafer is carried into/out of an in-stage and an out-stage in the aligner by means of this secondary transfer body. Thus, a period of time until the wafer W which has undergone exposure undergoes heat processing can be precisely managed, thereby enabling the formation of uniform line width.

13 Claims, 10 Drawing Sheets

SUBSTRATE DELIVERY APPARATUS AND COATING AND DEVELOPING PROCESSING SYSTEM

BACKGROUND OF THE INVENTION

1. Field of the Invention

The present invention relates to a substrate delivery apparatus disposed between a coating and developing processing apparatus for coating a substrate such as a semiconductor wafer, a glass substrate, or the like with a resist and developing the substrate and an aligner for exposing the substrate coated with the resist, and a coating and developing processing system provided with the substrate delivery apparatus.

2. Description of the Related Art

In the process of photoresist processing in semiconductor device fabrication, a substrate such as a semiconductor wafer (hereinafter referred to as "a wafer") is coated with a resist and exposed in accordance with a predetermined pattern, and thereafter a developing solution is supplied to the wafer, thereby performing developing processing for the wafer.

The aforesaid processing is hitherto performed using a system in which a coating and developing processing apparatus for performing resist coating and developing processing is connected to an aligner. Such a resist coating and developing processing apparatus includes processing units for individually performing a series of processing required for coating and developing processing for a wafer such as hydrophobic processing (adhesion processing) for enhancing adhesion of a resist, resist coating processing for coating the wafer with the resist, heat processing for heating the wafer coated with the resist to cure the resist, heat processing for heating the exposed wafer at a predetermined temperature, developing processing for performing developing processing for the exposed wafer, and the like, and the delivery of the wafer between these processing units is performed by a wafer transfer device. An interface section for delivering the wafer is disposed between the coating and developing processing apparatus and the aligner. The wafer coated with the resist by the coating and developing processing apparatus is delivered to the aligner via this interface section, and the wafer exposed by the aligner is delivered to the coating and developing processing apparatus via this interface section.

Incidentally, in order that a wiring pattern formed on the wafer or the like has even and uniform line width, in the aforesaid series of processing, it is specially important to manage a period of time from when the exposure of the wafer by the aligner is completed until the wafer undergoes heat processing.

The wafer transfer device which receives the wafer exposed by the aligner via the interface section and transfers it to a heat processing unit, however, performs delivery of the wafer from/to various kinds of processing units as described above, and thus the wafer transfer device is very busy. As a result, there is a disadvantage that in some cases the exposed wafer is kept waiting without being immediately transferred to the heat processing unit.

SUMMARY OF THE INVENTION

The present invention is made to settle the aforesaid disadvantage, and its object is to provide a substrate delivery apparatus and coating and developing processing system each capable of precisely managing a period of time from when the exposure of a substrate is completed until the substrate undergoes heat processing and forming uniform line width.

To attain the aforesaid object, a first aspect of the present invention is a substrate delivery apparatus, disposed between a coating and developing processing apparatus for coating a substrate with a resist and developing the exposed substrate and an aligner for exposing the substrate coated with the resist, for receiving and sending the substrate from/to these apparatus and aligner, comprising: a thermal processing section having a heating section for heating the substrate; and a first transfer section for transferring the substrate carried in from the aligner directly to the thermal processing section and transferring the substrate carried in from the coating and developing processing apparatus side to the aligner.

A second aspect of the present invention is a substrate delivery apparatus, disposed between a coating and developing processing apparatus, for coating a substrate with a resist and developing the exposed substrate and an aligner for exposing the substrate coated with the resist, for receiving and sending the substrate from/to these apparatus and aligner, comprising: a first holding section out of which the substrate is allowed to be carried to the aligner side, for receiving the unexposed substrate and temporarily holding it; a second holding section disposed on the same plane as the first holding section, into which the substrate is allowed to be carried from the aligner side, for receiving the exposed substrate and temporarily holding it; a thermal processing section having a heating section for heating the substrate; a first transfer section adjoining the coating and developing processing apparatus and disposed to be surrounded by the first holding section, the second holding section, and the thermal processing section, for transferring the substrate between the coating and developing processing apparatus, the first holding section, the second holding section, and the thermal processing section; and a second transfer section allowed to carry the substrate out of the first holding section and to carry the substrate into the second holding section, and allowed to carry the substrate into/out of an in-stage on which the substrate which has not been exposused in the aligner is mounted and an out-stage on which the exposed substrate is mounted.

A third aspect of the present invention is a coating and developing processing system connected to an aligner for exposing a substrate coated with a resist, comprising: a coating and developing processing apparatus for coating the substrate with the resist and developing the exposed substrate; and a substrate delivery apparatus disposed between the aligner and the coating and developing processing apparatus, the substrate delivery apparatus, comprising: a thermal processing section having a heating section for heating the substrate; and a transfer section for transferring the substrate carried in from the aligner directly to the thermal processing section and transferring the substrate carried in from the coating and developing processing apparatus side to the aligner.

In the present invention, such a structure that the exposed substrate is delivered directly to the thermal processing section via the transfer section possessed by the substrate delivery apparatus to undergo heat processing is provided, whereby the exposed substrate can be immediately transferred to the thermal processing section to undergo heat processing without being kept waiting. Consequently, a period of time until the substrate which has undergone exposure undergoes heat processing can be precisely managed, and thus uniform line width can be formed.

DETAILED DESCRIPTION OF THE PREFERRED EMBODIMENT

A Preferred embodiment of the present invention will be described below.

Figure 1:
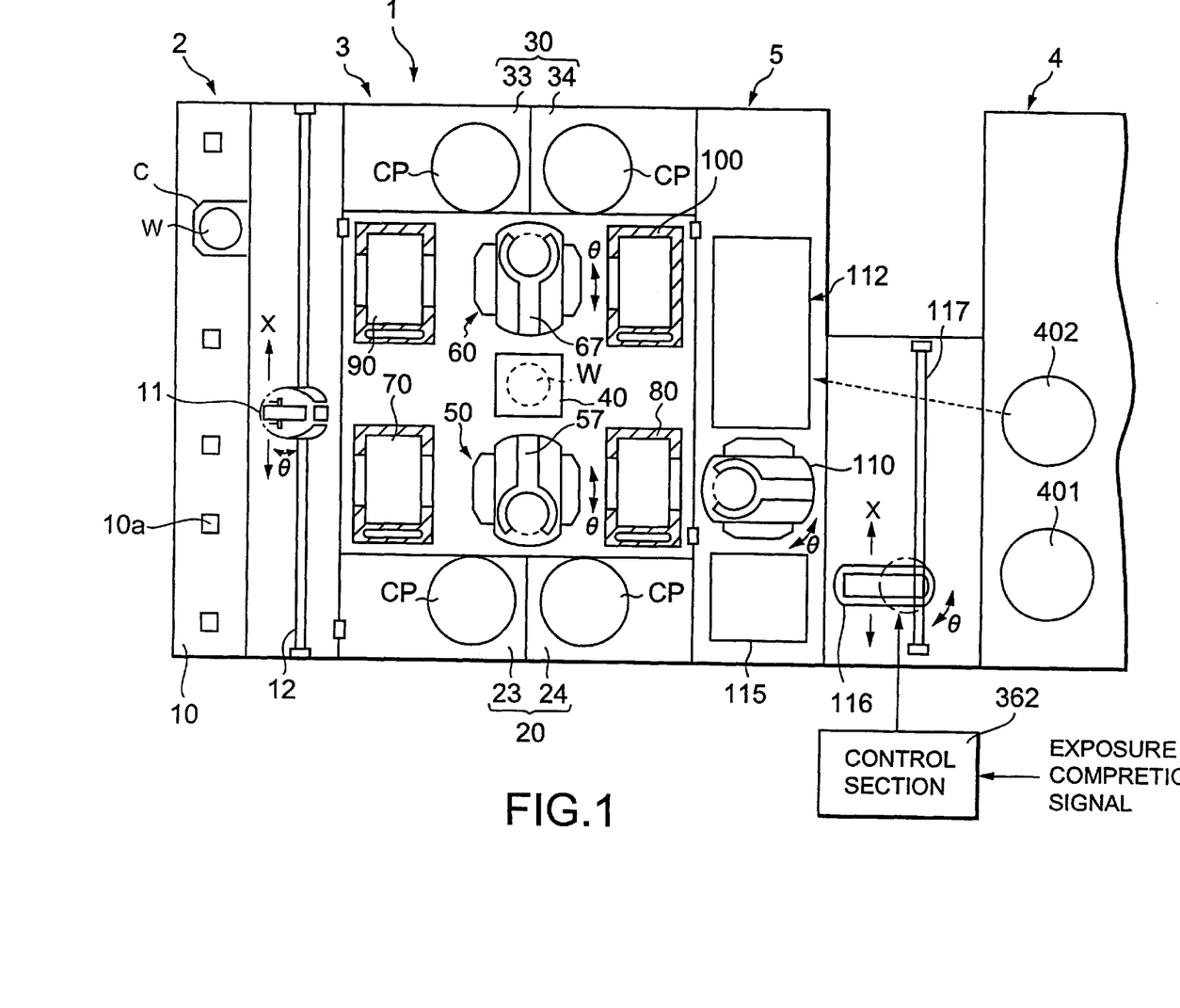
FIG. 1 is a plane view of a coating and developing processing system according to an embodiment of the present invention.
Figure 2:
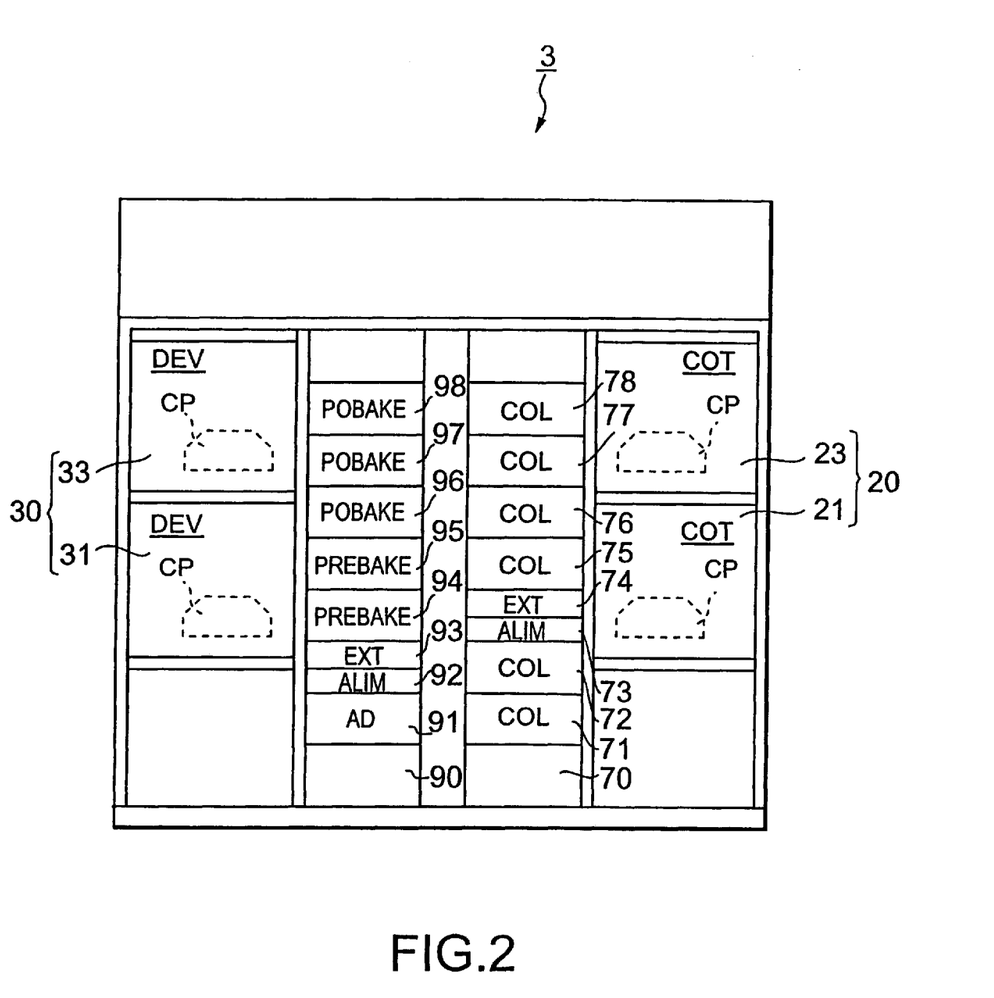
FIG. 2 is a left side view of a processing station in the coating and developing processing system shown in FIG. 1.
Figure 3:
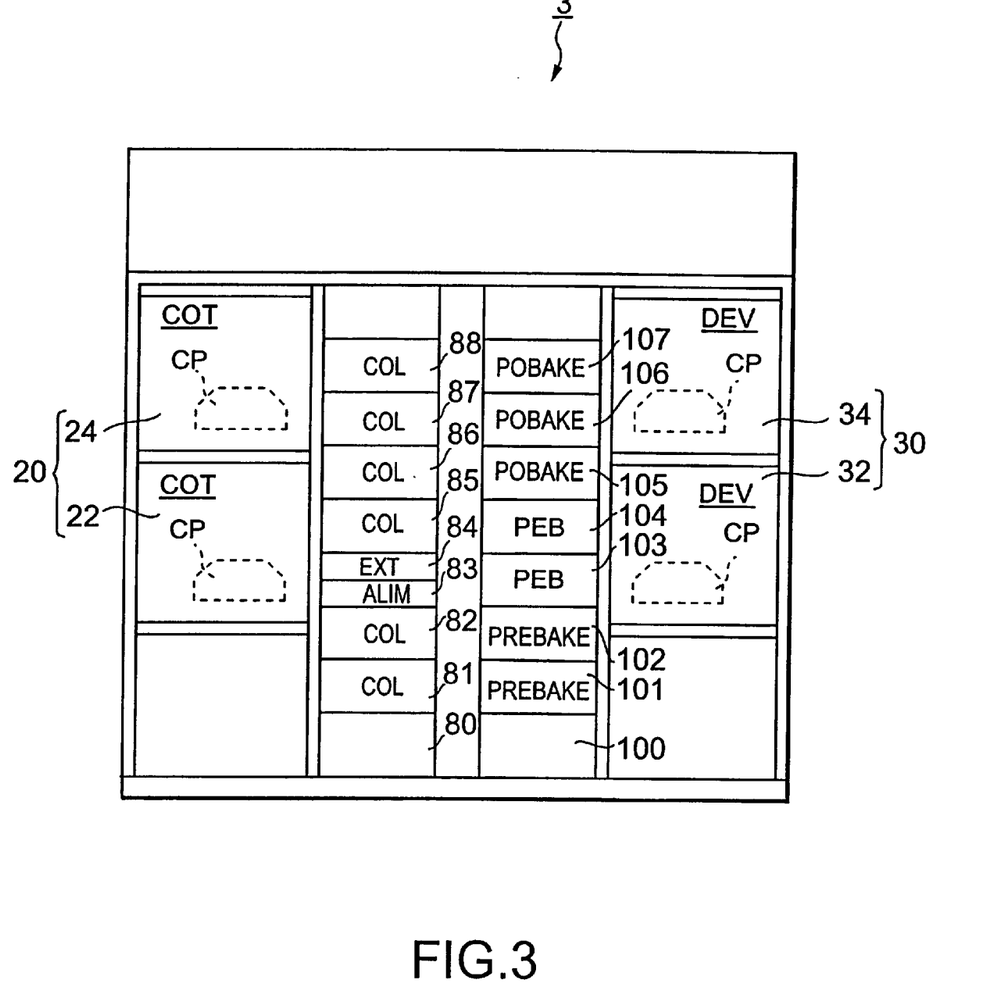
FIG. 3 is a right side view of the processing station in the coating and developing processing system shown in FIG. 1.

FIG. 1 to FIG. 3 show the appearance of a coating and developing processing system according to the embodiment, FIG. 1 shows the appearance in plan view, and FIG. 2 and FIG. 3 show the appearance in side view.

The coating and developing processing system 1 has structure in which a cassette station 2 for transferring, for example, 25 wafers W per cassette, as a unit, from/to the outside into/from the coating and developing processing system 1 and carrying the wafer W into/out of a cassette C, a processing station 3 in which various kinds of processing units each for performing predetermined processing for the wafers W one by one in coating and developing processes are multi-tiered, and an interface section 5 as an substrate delivery apparatus for receiving and sending the wafer W from/to an aligner 4 provided adjacent to the processing station 3 are integrally connected.

In this cassette station 2, a plurality of cassettes C can be mounted in a line along an X-direction (a vertical direction in FIG. 1) with respective transfer ports for the wafer W facing the processing station 3 side at positions of positioning projections 10a on a cassette mounting table 10. A wafer transfer body 11 movable in the direction of arrangement of the cassettes C (the X-direction) and in the direction of arrangement of the wafers W housed in the cassette C (a Z-direction; vertical direction) is movable along a transfer path 12 to be selectively accessible to each of the cassettes C.

The wafer transfer body 11 is also structured to be rotatable in a θ-direction so as to be accessible to an extension unit 74 included in a multistage unit section of a first cooling processing unit group 70 and an alignment unit 92 included in a first heat processing unit group 90 both of which will be described later.

In the processing station 3, a resist coating unit group 20 is disposed at the front thereof, and a developing processing unit group 30 is disposed at the back thereof. It is naturally suitable to dispose the developing processing unit group 30 at the front and the resist coating unit group 20 at the back.

As shown in FIG. 2 and FIG. 3, in the resist coating unit group 20, resist coating units 21 and 22 each for performing resist coating processing for the wafer W by mounting the wafer W on a spin chuck and applying a resist solution to the wafer W in a cup CP are arranged side by side, and resist coating units 23 and 24 are piled on top of the resist coating units 21 and 22.

In the developing processing unit group 30, developing processing units 31 and 32 each for performing developing processing for the wafer W by mounting the wafer W on a spin chuck and applying a developing solution to the wafer W in a cup CP are arranged side by side, and developing processing units 33 and 34 are piled on top of the developing processing units 31 and 32.

A delivery table 40 on which the wafer W can be freely mounted is provided at the center of the processing station 3.

The resist coating unit group 20 and the developing processing unit group 30 face each other across the delivery table 40, a first transfer device 50 is provided between the resist coating unit group 20 and the delivery table 40, and a second transfer device 60 is provided between the developing processing unit group 30 and the delivery table 40.

The first transfer device 50 and the second transfer device 60 have basically the same structure, and the structure of the first transfer device 50 will be explained based on FIG. 4. The first transfer device 50 is provided with a wafer transfer means 54 which is ascendable and descendable in the vertical direction (the Z-direction) inside a cylindrical supporter 53 composed of a pair of wall portions 51 and 52 which are connected to each other at respective upper ends and lower ends and face each other. The cylindrical supporter 53 is connected to a rotating shaft of a motor 55 and rotated integrally with the wafer transfer means 54 around the rotating shaft by rotational driving force of the motor 55. Accordingly, the wafer transfer means 54 is rotatable in the θ-direction.

A plurality of, for example, two tweezers 57 and 58 as holding members each for holding the wafer W are vertically provided on a transfer base 56 of the wafer transfer means 54. The tweezers 57 and 58 have basically the same structure and each have a shape and a size capable of freely passing through a side opening between both the wall portions 51 and 52 of the cylindrical supporter 53. Each of the tweezers 57 and 58 is movable back and forth by a motor (not illustrated) contained in the transfer base 56. It should be mentioned that the second transfer device 60 is provided with tweezers 67 and 68 which have the same function and structure as the tweezers 57 and 58.

The first cooling processing unit group 70 and a second cooling processing unit group 80 which are composed of various kinds of cooling system processing units are disposed on either side of the first transfer device 50 in the vicinity of the resist coating unit group 20, and the first heat processing unit group 90 and a second heat processing group 100 which are composed of various kinds of heating system processing units are disposed on either side of the second transfer device 60 in the vicinity of the developing processing unit group 30. The first cooling processing unit group 70 and the first heat processing unit group 90 are disposed on the cassette station 2 side, and the second cooling processing unit group 80 and the second heat processing unit group 100 are disposed on the interface section 5 side.

If the structure of the first cooling processing unit group 70 and the first heat processing unit group 90 is explained based on FIG. 2 in which the processing station 3 is seen from the cassette station 2 side, in the first cooling processing unit group 70, cooling units 71 and 72 each for performing cooling processing for the wafer W at a predetermined temperature, an alignment unit 73 for aligning the wafer W, the extension unit 74 for making the wafer W wait, and cooling processing units 75, 76, 77, and 78 are, for example, eight-tiered from the bottom in order. In the first heat processing unit group 90, an adhesion unit for enhancing the adhesion of the resist and the wafer W, the alignment unit 92, an extension unit 93, pre-baking units 94 and 95 each for performing heat processing for the wafer W coated with the resist, and post-baking units 96, 97, and 98 each for performing heat processing for the wafer W which has undergone developing processing are, for example, eight-tiered from the bottom in order.

If the structure of the second cooling processing unit group 80 and the second heat processing unit group 100 is explained based on FIG. 3 in which the processing station 3 is seen from the interface section 5 side, in the second cooling processing unit group 80, cooling units 81 and 82, an alignment unit 83, an extension unit 84, and cooling processing units 85, 86, 87, and 88 are, for example, eight-tiered from the bottom in order. In the second heat processing unit group 100, pre-baking units 101 and 102, post-exposure baking units 103 and 104 each for performing heat processing for the wafer W which has undergone exposure processing, and post-baking units 105, 106, and 107 are, for example, seven-tiered from the bottom in order.

Figure 5:
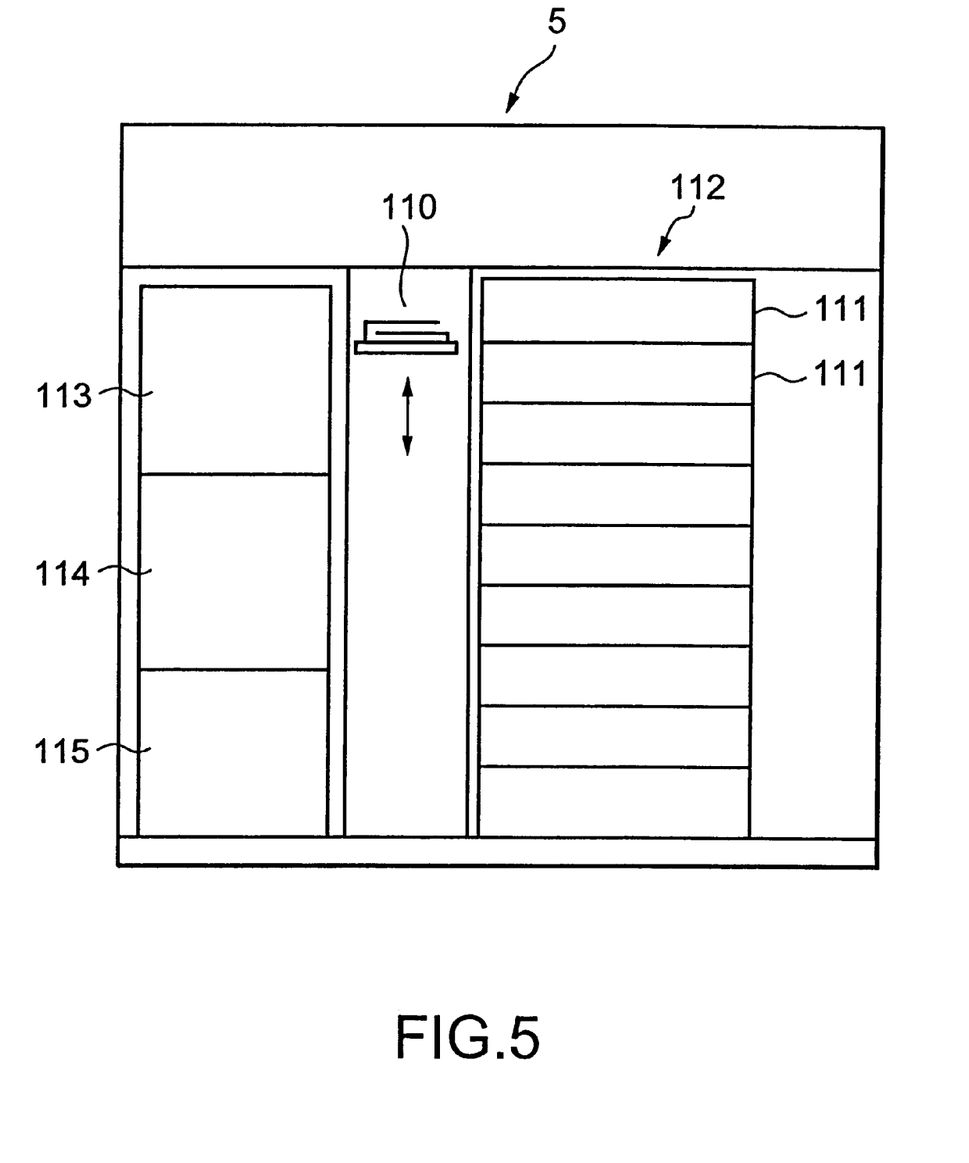
FIG. 5 is a right side view of an interface section in the coating and developing processing system shown in FIG. 1.

In the interface section 5, a transfer device 110 is disposed to face the second cooling processing unit group 80 in the processing station 3. FIG. 5 shows this interface section 5 in side view. In the interface section 5, a thermal processing unit group 112 in which thermal processing units 111 are multi-tiered is disposed on one side and a peripheral aligner 113, a buffer cassette 114, and a wafer holding section 115 which are vertically tiered from the top in order are disposed on the other side so that the transfer device 110 is put between them.

Figure 4:
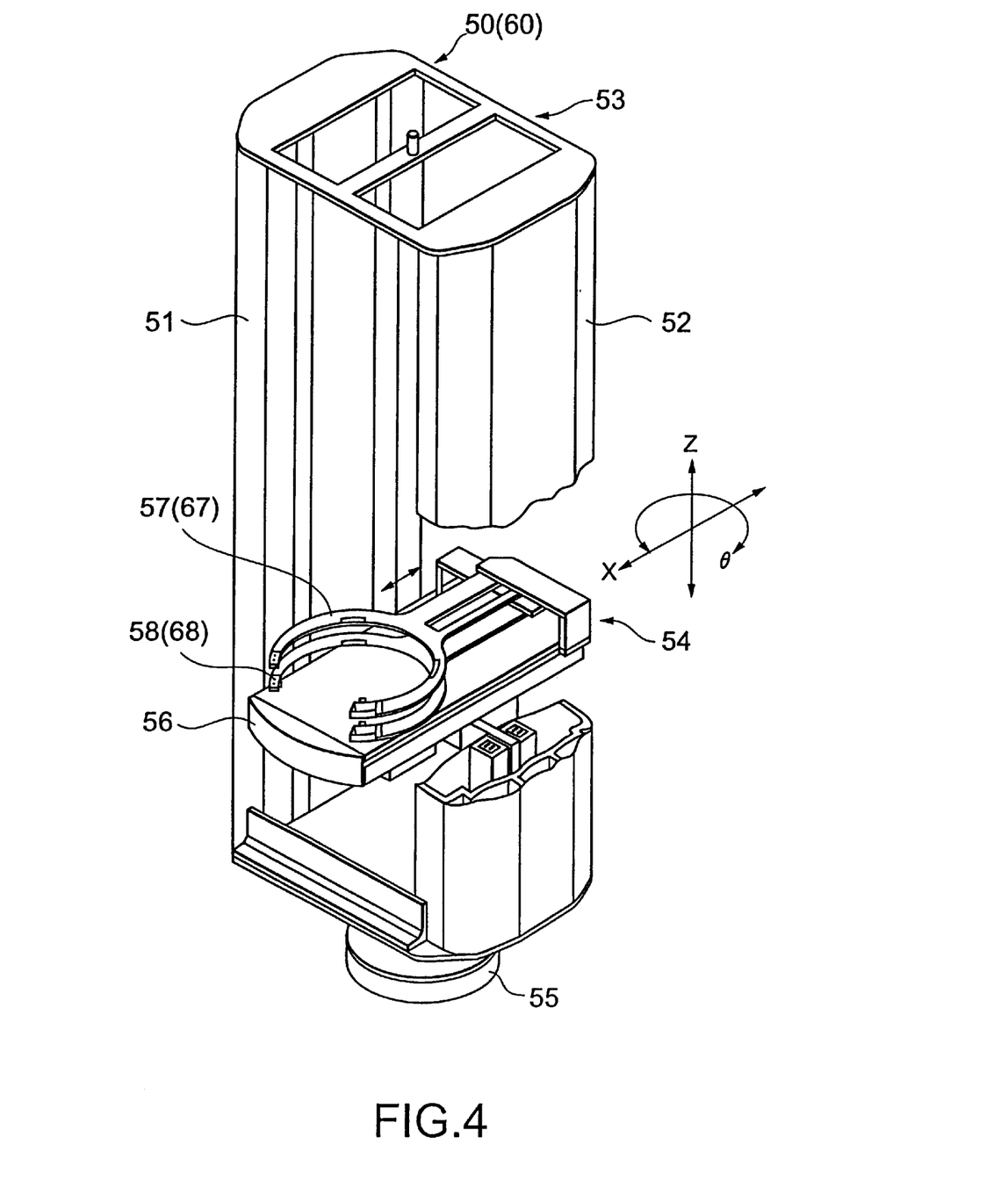
FIG. 4 is a perspective view showing the structure of a first transfer device in the coating and developing processing system shown in FIG. 1.

The transfer device 110 has basically the same structure as the first transfer device 50 (the second transfer device 60) shown in FIG. 4 and hence can move the wafer W in the vertical direction (the Z-direction), and also it is structured to be rotatable in the θ-direction so as to be able to receive and send the wafer W from/to the alignment unit 83 and the extension unit 84 of the second cooling processing unit group 80 in the processing station 3, respective thermal processing units 111, the peripheral aligner 113, the buffer cassette 114 vertically housing, for example, 25 wafers W, and the wafer holding section 115, which are arranged around the transfer device 110.

Figure 6:
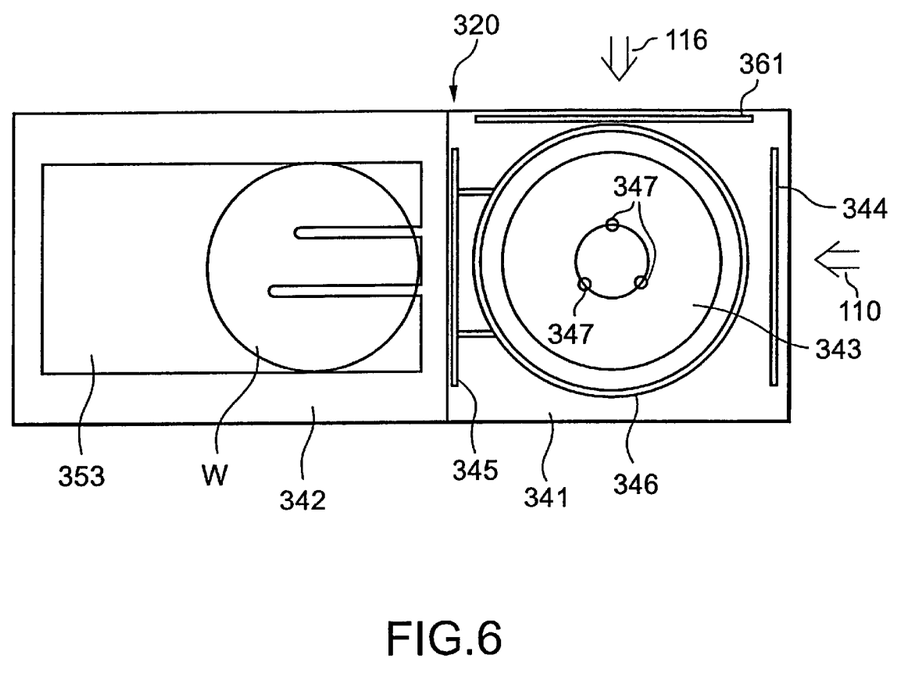
FIG. 6 is a plan view of a thermal processing unit in the coating and developing processing system shown in FIG. 1.
Figure 7:
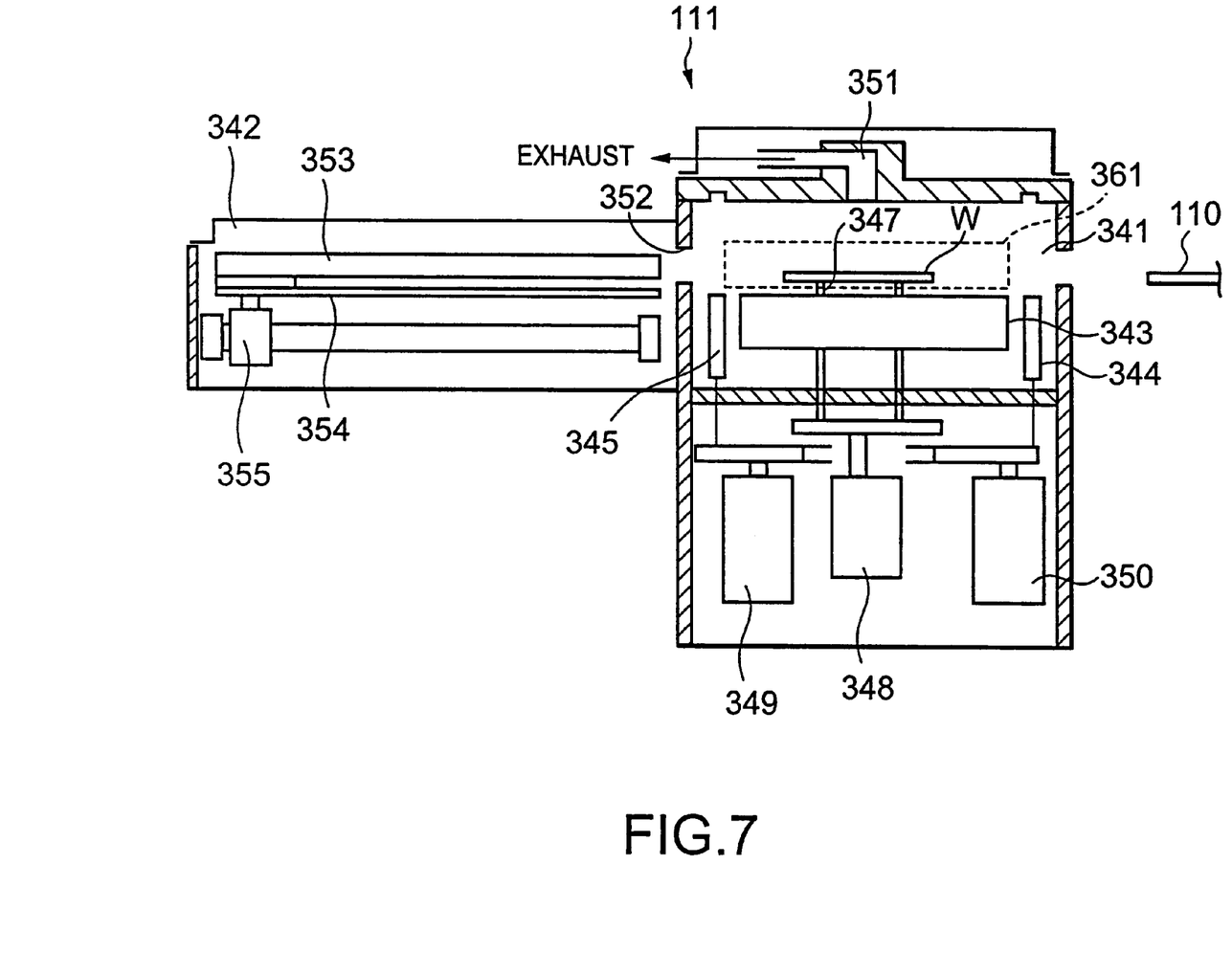
FIG. 7 is a sectional view of the thermal processing unit in the coating and developing processing system shown in FIG. 1.

FIG. 6 is a plan view of the aforesaid thermal processing unit 111, and FIG. 7 is a sectional view thereof.

As shown in FIG. 6 and FIG. 7, the thermal processing unit 111 includes a heat processing chamber 341 having a hot plate 343 and a cooling processing chamber 342 provided adjacent thereto as a temperature control section for controlling the temperature of a substrate. The thermal processing unit 111 further includes a first gate shutter 344 which is opened and closed when the wafer W is delivered from/to the transfer device 110, a second gate shutter 345 for opening and closing a portion between the heat processing chamber 341 and the cooling processing chamber 342, a ring shutter 346 which is raised and lowered together with the second gate shutter 345 while surrounding the wafer w around the hot plate 343, and a third gate shutter 361 which is opened and closed when the wafer W is delivered from/to a secondary transfer body 116 which will be described later. Moreover, three lifting pins 347 for mounting the wafer W thereon and raising and lowering the wafer W are provided to be ascendable and descendable in the hot plate 343.

Provided below the heat processing chamber 341 are a raising and lowering mechanism 348 for raising and lowering the aforesaid three lifting pins 347, a raising and lowering mechanism 349 for raising and lowering the ring shutter 346 together with the second gate shutter 345, and a raising and lowering mechanism 350 for raising and lowering the first gate shutter 344 and the third gate shutter 361 to thereby open and close them. Moreover, air inside the heat processing chamber 341 is exhausted through an exhaust pipe 351.

The heat processing chamber 341 and the cooling processing chamber 342 communicate with each other via a communicating port 352, and a chill plate 353 for mounting the wafer W thereon and cooling the wafer W is structured to be movable in a horizontal direction along a guide plate 354 by means of a moving mechanism 355. Thereby, the chill plate 353 can get into the heat processing chamber 341 through the communicating port 352, receives the wafer W which has been heated by the hot plate 343 in the heat processing chamber 341 from the lifting pins 347, carries the wafer W into the cooling processing chamber 342, and returns the wafer W to the lifting pins 347 after the wafer W is cooled.

Figure 8:
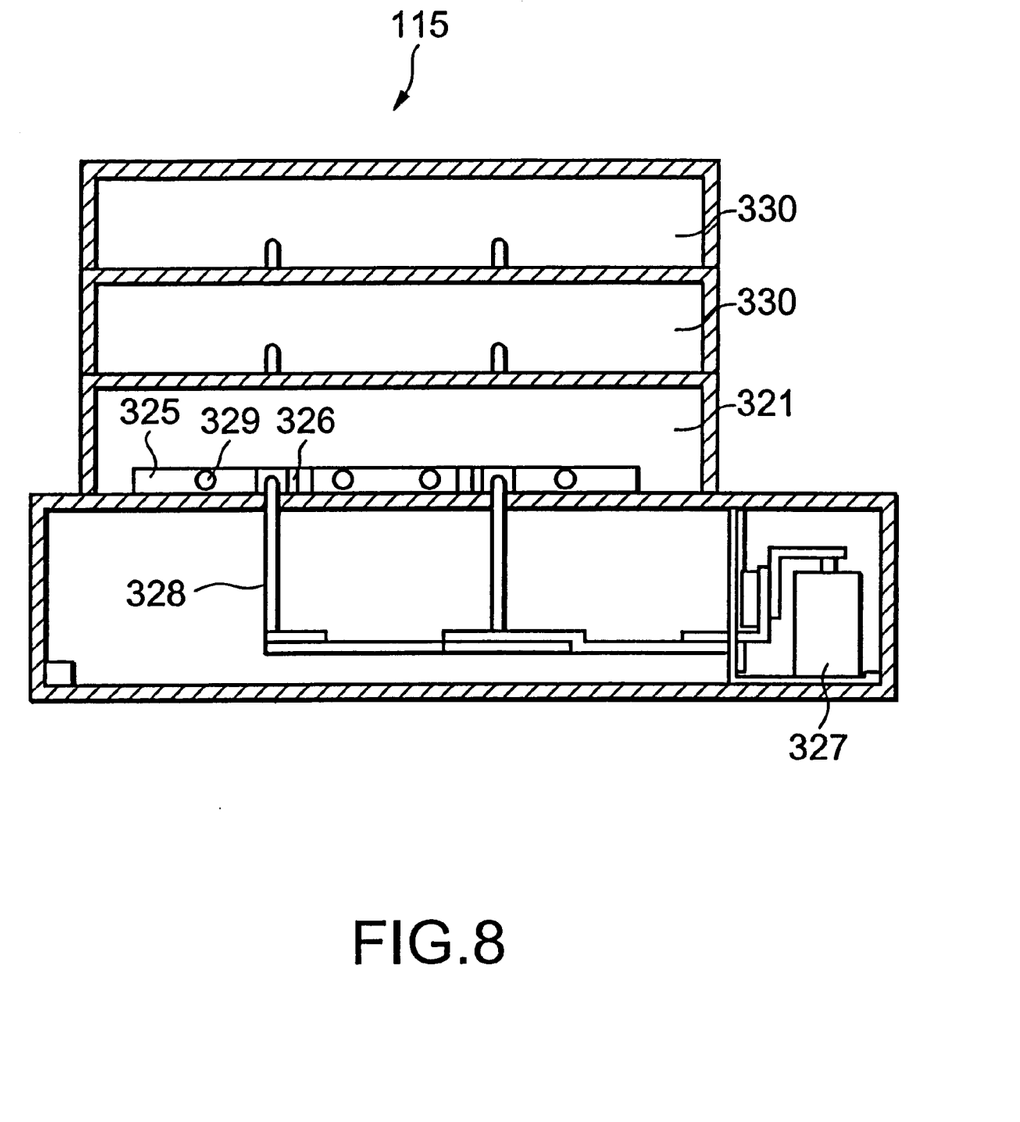
FIG. 8 is a sectional view showing the structure of a wafer holding section in the coating and developing processing system shown in FIG. 1.

FIG. 8 is a sectional view showing the structure of the aforesaid wafer holding section 115.

As shown in FIG. 8, in this wafer holding section 115, a cooling unit 321 as a temperature control table for controlling the temperature of the wafer W at a temperature close to an ordinary temperature at the lower tier. The cooling unit 321 includes a cooling mounting table 325 which can cool the wafer W placed in the cooling unit 321 and, for example, three ascent/descent pins 328 formed to be vertically movable through through-holes 326 bored in the cooling mounting table 325 by the drive of a cylinder 327. A circulating path 329 through which constant-temperature water the temperature of which is controlled at 23° C. or the like circulates is provided inside the cooling mounting table 325, whereby the wafer W mounted on the cooling mounting table 325 is cooled. Mounting tables 330 and 330 on which the wafer W can be mounted are vertically two-tiered on top of the uppermost cooling unit 321. Incidentally, the unexposed wafer W is temporarily held in the cooling unit 321, and the wafer W which has been exposed and has undergone heating and cooling processing is temporarily held on the mounting tables 330 or 330.

As shown in FIG. 1, between the thermal processing unit group 112 and the wafer holding section 115, and the aligner 4, the secondary transfer body 116 movable in the vertical direction (the Z-direction) and the X-direction and rotatable in the θ-direction is provided to be movable along a transfer path 117 and carries the wafer W into/out of each of the thermal processing units 111 of the thermal processing unit group 112, the cooling unit 321 of the wafer holding section 115, and an in-stage 401 on which the unexposed wafer W is mounted and an out-stage 402 on which the exposed wafer W is mounted in the aligner 4.

The coating and developing processing system 1 according to the embodiment of the present invention is structured as above. Next, the operation of the coating and developing system 1 will be explained.

First, in the cassette station 2, the wafer transfer body 11 gets access to the cassette C and takes out one unprocessed wafer W. This wafer W is then transferred to the alignment unit 92 of the first heat processing unit group 90 by the wafer transfer body 11. The wafer W aligned in the alignment unit 92 is transferred to the adhesion unit 91 included in the same first heat processing unit group 90 by the second transfer device 60. Subsequently, after undergoing hydrophobic processing, the wafer W is transferred to the delivery table 40 by the second transfer device 60.

Thereafter, the wafer W is transferred from the delivery table 40 to the first cooling processing unit group 70 by the first transfer device 50 and carried into the cooling unit 72, for example, of the first cooling processing unit group 70 to be subjected to cooling processing.

The wafer W which has undergone the predetermined cooling processing in the cooling unit 72 is transferred to the resist coating unit group 20 by the first transfer device 50.

The wafer W transferred to the resist coating unit group 20 is carried into, for example, the resist coating unit 21, where a resist film is formed. The wafer W on which the resist film is formed is then transferred to the delivery table 40 by the first transfer device 50.

The wafer W transferred to the delivery table 40 is transferred this time to the second heat processing unit group 100 by the second transfer device 60, and then carried into, for example, the pre-baking unit 101 included in the second heat processing unit group 100 to be subjected to predetermined heat processing.

After the completion of the heat processing, the wafer W is transferred to the second cooling processing unit group 80 by the second transfer device 60, and then carried into, for example, the cooling unit 85 of the second cooling processing unit group 80 to be subjected to cooling processing. The wafer W which has undergone the cooling processing in the cooling unit 85 is then carried into the extension unit 84.

The wafer W carried into the extension unit 84 is carried into the interface section 5 by the transfer device 110, and then first brought into the peripheral aligner 113 in the interface section 5 to be subjected to peripheral exposure processing.

The wafer W which has undergone the peripheral exposure processing is temporarily housed in the buffer cassette 114 by the transfer device 110.

The wafer W housed in the buffer cassette 114 is transferred to the cooling unit 321 in the wafer holding section 115 by the transfer device 110, and the temperature of the wafer W is controlled at a temperature close to an ordinary temperature, for example, at about 23° C. As a result, thereafter the temperature in the aligner 4 is no longer influenced by the transfer of this wafer W into the aligner 4.

The wafer W the temperature of which is controlled at the temperature close to the ordinary temperature in the cooling unit 321 in the wafer holding section 115 is mounted on the in-stage 401 in the aligner 4 by the secondary transfer body 116.

The wafer W mounted on the in-stage 401 then undergoes exposure processing in the aligner 4, and after the completion of the exposure processing, the wafer W is mounted on the out-stage 402.

The wafer W mounted on the out-stage 402 is transferred directly to any one of the thermal processing units 111 in the thermal processing unit group 112 by the secondary transfer body 116. On this occasion, a control section 362 inputs an exposure completion signal which shows the completion time of the exposure of the wafer W from the aligner 4 and controls the transfer operation of the secondary transfer body 116 based on this signal so that a period of time from when the exposure of the wafer w is completed until the wafer W is transferred to the thermal processing unit 111 is always constant. For example, even at the time when the secondary transfer body 116 is scheduled to transfer the wafer W from the cooling unit 321 in the wafer holding section 115 onto the in-stage 401 in the aligner 4, the control section 362 suspends the above operation (interrupts the operation), and controls the secondary transfer body 116 so that the secondary transfer body 115 transfers the wafer W from the out-stage 402 to the thermal processing unit group 112 so that the period of time from when the exposure of the wafer W is completed until the wafer W is transferred to the thermal processing unit 111 is always constant.

The wafer W transferred to the thermal processing unit 111 undergoes thermal processing and temperature control at the ordinary temperature.

The wafer W which has undergone the thermal processing and the temperature control at the ordinary temperature is carried into the extension unit 84 in the processing station 3 by the transfer device 110.

The wafer W carried into the extension unit 84 is transferred to the delivery table 40 by the first transfer device 50, thereafter brought into, for example, the developing processing unit 31 in the developing processing unit group 30 from the delivery table 40 by the second transfer device 60, and subjected to predetermined developing processing.

The wafer W which has undergone the developing processing is carried into, for example, the post-baking unit 105 in the second heat processing unit group 100 by the second transfer device 60, and subjected to heat processing required after the developing processing.

The wafer W which has undergone the heat processing in the post-baking unit 105 is transferred to the delivery table 40 by the second transfer device 60.

The wafer W transferred to the delivery table 40 is then carried into, for example, the cooling unit 71 in the first cooling processing unit group 70 by the first transfer device 50, and subjected to cooling processing.

The wafer W which has undergone the cooling processing is then carried into the extension unit 74 and stands by there. Thereafter, the wafer W is carried out of the extension unit 74 by the wafer transfer body 11 and housed in the cassette C on the cassette mounting table 10. Thus, a series of coating and developing processing for the wafer W is completed.

As described above, in the coating and developing processing system 1 in this embodiment, the exposed wafer W can be immediately transferred to the thermal processing unit without being kept waiting and subjected to heat processing. Accordingly, a period of time until the wafer W which has undergone exposure undergoes heat processing can be precisely managed, resulting in the formation of uniform line width.

Further, in this embodiment, the cooling processing chamber 342 is integrally provided in addition to the heat processing chamber 341 specially in the thermal processing unit 111, whereby the temperature of the wafer W which has undergone heat processing can be immediately controlled, leading to precise temperature management. As a result, uniform line width can be formed.

Furthermore, in this embodiment, the processing station 3, the wafer holding section 115, and the thermal processing unit 111 are disposed specially around the transfer device 110 in the interface section 5, whereby the transfer device 110 need not move in the x-direction and the Y-direction, resulting in the speed-up of the transfer device 110.

Next, another embodiment of the present invention will be explained.

Figure 9:
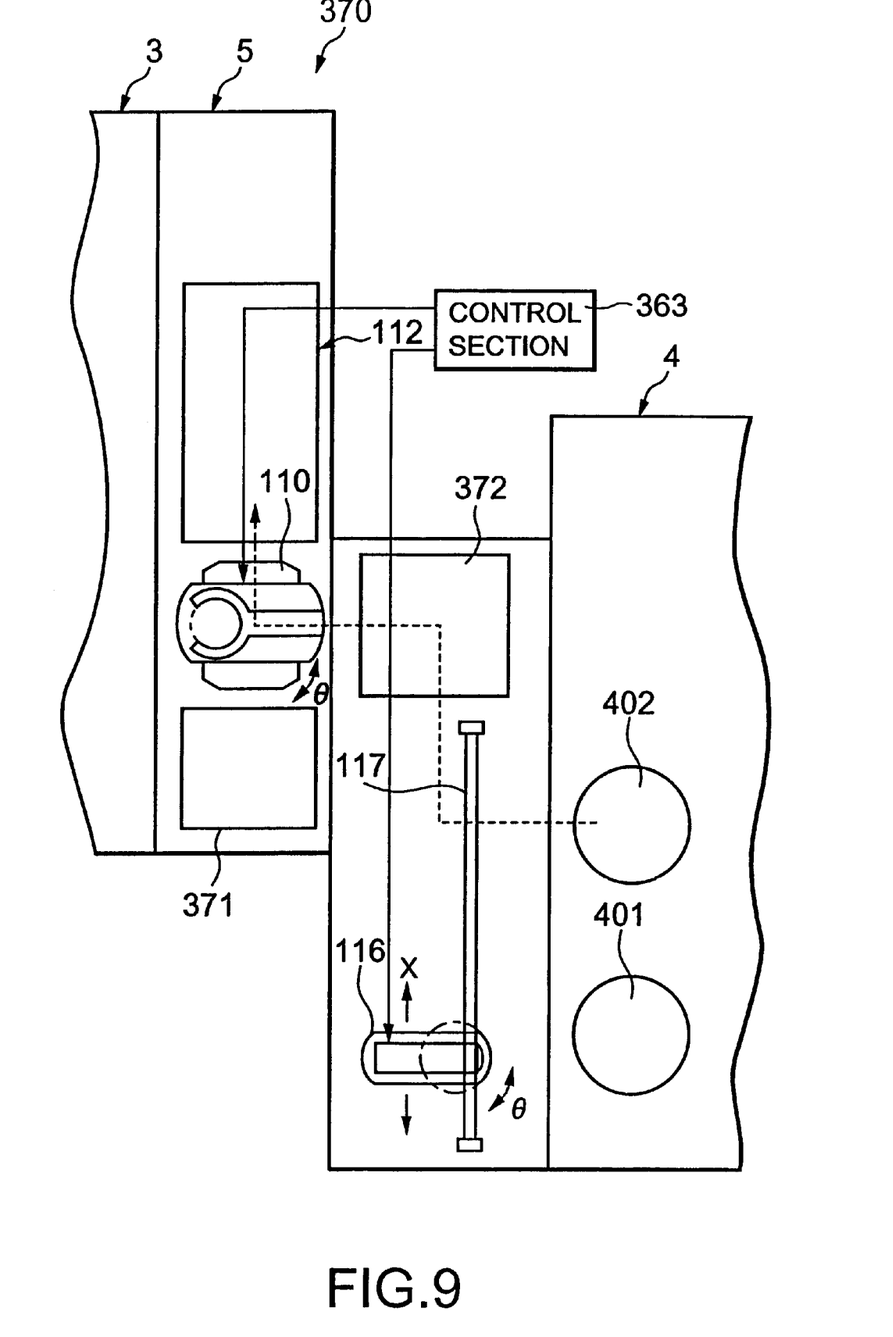
FIG. 9 is a plan view showing the structure of a coating and developing processing system according to another embodiment of the present invention.

FIG. 9 is a plan view showing the structure of a coating and developing processing system 370 according to another embodiment of the present invention.

In the coating and developing processing system 370 shown in FIG. 9, a cooling unit 371 as a first holding section out of which the wafer W can be carried by the secondary transfer body 116, for receiving the unexposed wafer W and temporarily holding it and a mounting table 372 as a second holding section into which the wafer W can be carried by the secondary transfer body 116, for receiving the exposed wafer W and temporarily holding it are disposed on the same plane. The transfer device 110 is structured to be able to receive and send the wafer W from/to the cooling unit 371, the thermal processing unit 111, and the mounting table 372.

In the coating and developing processing system 370 according to this embodiment, specially, the cooling unit 371 and the mounting table 372 are disposed on the same plane, whereby a stroke of transfer of the wafer W in the vertical direction by the secondary transfer body 116 is decreased, thus allowing the secondary t transfer body 116 to be downsized and speeded up.

Further, in this embodiment, specially such a structure that the wafer W is transferred from the out-stage 402 to the thermal processing unit 111 via the mounting table 372 is provided, whereby the mounting table 372 fills the role of a so-called timing buffer, and thus the period of time to transfer the wafer W from the out-stage 402 to the thermal processing unit 111 can be easily made constant by the proper control of the transfer timing of the secondary transfer body 116 and the transfer device 110 by a control section 363.

Next, still another embodiment of the present invention will be explained.

Figure 10:
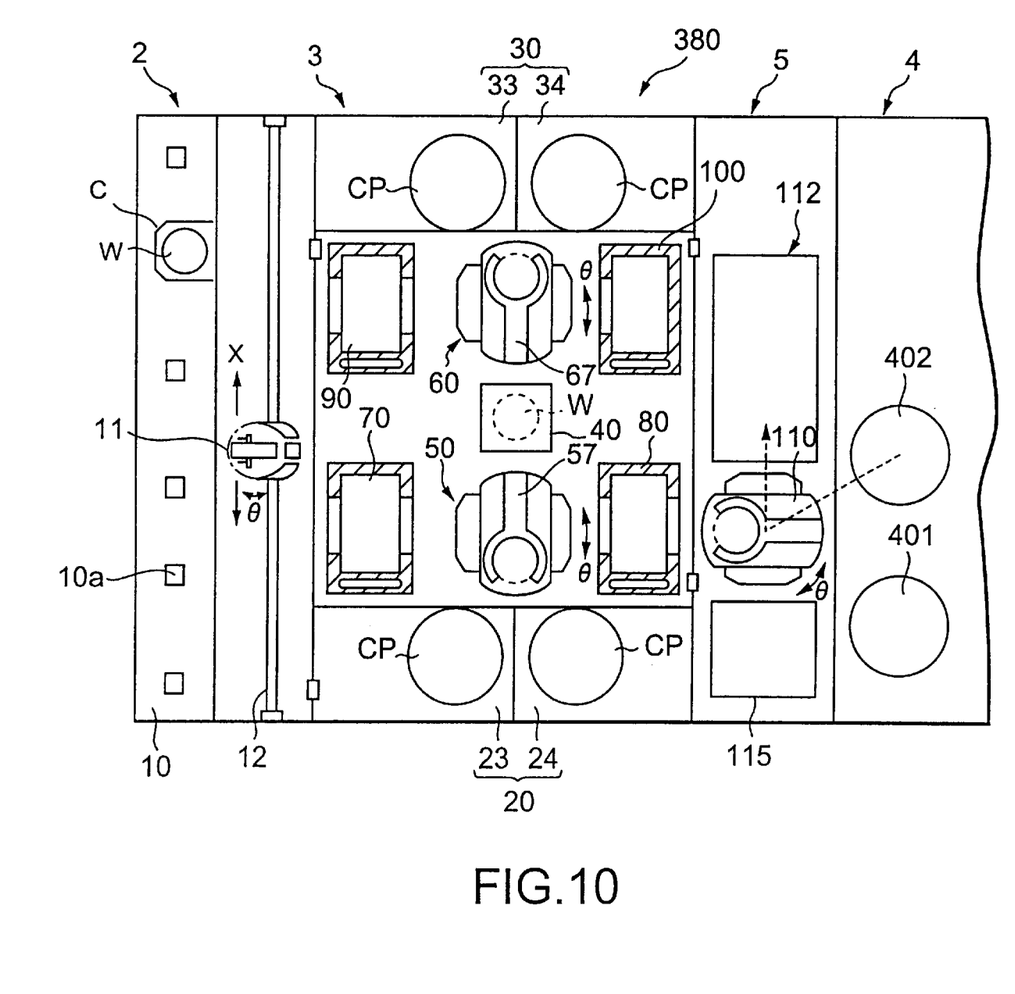
FIG. 10 is a plan view showing the structure of a coating and developing processing system according to still another embodiment of the present invention.

FIG. 10 is a plan view showing the structure of a coating and developing processing system 380 according to this embodiment.

In this system, the transfer device 110 can directly get access not only to the processing station 3, the thermal processing unit group 112, and the wafer holding section 115, but also to the in-stage 401 and the out-stage 402. Therefore, the unexposed wafer W carried in from the processing station 3 side is delivered to the in-stage 401 via the transfer device 110, the wafer holding section 115, and the transfer device 110. The exposed wafer W carried out of the out-stage 402 is transferred to the thermal processing unit group 112 via the transfer device 110 and then transferred to the processing station 3 side via the transfer device 110. Also in this embodiment, similarly to the embodiment shown first, such control that the exposed wafer W is transferred to the heat processing unit group 112 via the transfer device 110 may be preferentially performed so that the period of time from when the exposure is completed until the wafer W is transferred to the thermal processing unit is constant.

Incidentally, although the aforesaid embodiments are explained with the given examples in which the wafer W is used as a substrate, a substrate to be used in the present invention is not limited to the wafer, and, for example, an LCD substrate and the like are also suitable.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate delivery apparatus, disposed between a coating and developing processing apparatus that coats a substrate with a resist and develops the exposed substrate and an aligner that exposes the substrate coated with the resist, that receives and sends the substrate from/to these apparatus and aligner, comprising:
   a thermal processing section having a heating section that heats the substrate;
   a first transfer section that transfers the substrate carried in from the aligner directly to said thermal processing section and transfers the substrate carried in from the coating and developing processing apparatus side to the aligner; and
   a holding section that at least receives the unexposed substrate and temporarily holds it.

2. The substrate delivery apparatus as set forth in claim 1, further comprising:
   a control section that receives an exposure completion signal outputted from the aligner; and
   a controller that controls said first transfer section based on the exposure completion signal so that a period of time from when the exposure of the substrate by the aligner is completed until the substrate is transferred to said thermal processing section is constant.

3. The substrate delivery apparatus as set forth in claim 1, wherein said thermal processing section has a temperature control section that controls the temperature of the substrate heated in the heating section, in the vicinity of the heating section.

4. The substrate delivery apparatus as set forth in claim 1, further comprising:
   a second transfer section, disposed adjacent to the coating and developing processing apparatus and between said holding section and said thermal processing section, that transfers the substrate between the coating and developing processing apparatus, said holding section, and said thermal processing section.

5. The substrate delivery apparatus as set forth in claim 1, wherein said holding section has vertically multi-tiered temperature control tables that each receive the unexposed substrate from said first transfer section, holds it temporarily, and controls the temperature of the substrate at a temperature close to an ordinary temperature.

6. The substrate delivery apparatus as set forth in claim 1, wherein said thermal processing sections are vertically multi-tiered.

7. The substrate delivery apparatus as set forth in claim 1, wherein a peripheral exposure section that peripherally exposes the unexposed substrate and a buffer section that holds the peripherally exposed substrates vertically in multiple tiers are arranged together with said holding section vertically in a line and the peripheral exposure section and the buffer section are allowed to receive and send the substrate from/to said first transfer section.

8. The substrate delivery apparatus as set forth in claim 1, wherein an in-stage on which the substrate which has not been exposed in the aligner is mounted and an out-stage on which the exposed substrate is mounted are disposed between the aligner and said first transfer section.

9. The substrate delivery apparatus as set forth in claim 1, wherein said first transfer section is surrounded by the coating and developing processing apparatus, said thermal processing section, and in-stage on which the substrate which has not been exposed in the aligner is mounted, and an out-stage on which the exposed substrate is mounted, and allowed to receive and send the substrate from/to these apparatus, section, and stages.

10. The substrate delivery apparatus as set forth in claim 9, further comprising:
a holding section adjoining said first transfer section, that at least, receives the unexposed substrate and temporarily holds it,
wherein said first transfer section is allowed to receive and send the substrate from/to said holding section.

11. A substrate delivery apparatus, disposed between a coating and developing processing apparatus, that coats a substrate with a resist and develops the exposed substrate and an aligner that exposes the substrate coated with the resist, that receives and sends the substrate from/to these apparatus and aligner, comprising:
a first holding section out of which the substrate is allowed to be carried to the aligner side, and receives the unexposed substrate and temporarily it;
a second holding section disposed on the same plane as said first holding section, into which the substrate is allowed to be carried from the aligner side, that receives the exposed substrate and temporarily holds it;
a thermal processing section having a heating section that heats the substrate;
a first transfer section adjoining the coating and developing processing apparatus and disposed to be surrounded by said first holding section, said second holding section, and said thermal processing section, that transfers the e substrate between the coating and developing processing apparatus, said first holding section, said second holding section, and said thermal processing section; and
a second transfer section that carries the substrate out of said first holding section and to carry the substrate into said second holding section, and allowed to carry the substrate into/out of an in-stage on which the substrate which has not been exposed in the aligner is mounted and an out-stage on which the exposed substrate is mounted.

12. The substrate delivery apparatus as set forth in claim 11, further comprising:
a controller that controls the period of time to transfer the substrate carried in from the aligner side to said thermal processing section via said second transfer section, said second holding section, and said first transfer section so that the period of time is constant.

13. A coating and developing processing system connected to an aligner for exposing a substrate coated with a resist, comprising:
a coating and developing processing apparatus that coats the substrate with the resist and develops the exposed substrate; and
a substrate delivery apparatus disposed between the aligner and said coating and developing processing apparatus,
said substrate delivery apparatus, comprising:
a thermal processing section having a heating section that heats the substrate;
a transfer section that transfers the substrate carried in from the aligner directly to said thermal processing section and transfers the substrate carried in from said coating and developing processing apparatus side to the aligner; and
a holding section that at least receives the unexposed substrate and temporarily holds it.

* * * * *